United States Patent [19]

Mohammad

[11] Patent Number: 5,385,853
[45] Date of Patent: Jan. 31, 1995

[54] METHOD OF FABRICATING A METAL OXIDE SEMICONDUCTOR HETEROJUNCTION FIELD EFFECT TRANSISTOR (MOSHFET)

[75] Inventor: S. Noor Mohammad, Hopewell Junction, N.Y.

[73] Assignee: International Business Machines Corporation, Armonk, N.Y.

[21] Appl. No.: 984,607

[22] Filed: Dec. 2, 1992

[51] Int. Cl.⁶ ............................................. H01L 21/265
[52] U.S. Cl. ........................................ 437/41; 437/67;
437/203; 437/915; 257/330; 257/332
[58] Field of Search .................... 437/41, 67, 203, 915;
257/330, 332

[56] References Cited

U.S. PATENT DOCUMENTS

| | | | |
|---|---|---|---|
| 4,717,681 | 1/1988 | Curran | 437/31 |
| 4,771,013 | 9/1988 | Curran | 437/31 |
| 4,788,158 | 11/1988 | Chatterjee | 437/51 |
| 4,824,793 | 4/1989 | Richardson et al. | 437/47 |
| 4,837,178 | 6/1989 | Ohshima et al. | 437/33 |
| 5,034,341 | 7/1991 | Itoh | 437/52 |
| 5,164,325 | 11/1992 | Cogan et al. | 437/29 |
| 5,308,785 | 5/1994 | Comfort et al. | 437/67 |

*Primary Examiner*—George Fourson
*Assistant Examiner*—David Mason
*Attorney, Agent, or Firm*—Charles W. Peterson, Jr.

[57] ABSTRACT

Method of fabricating a vertical Metal Oxide Semiconductor Heterojunction Field Effect Transistor (MOSHFET) which is in a layered wafer made by successively growing an N+ silicon layer, and a N− silicon layer, a P− $Si_{1-x}Ge_x$ layer, a P− Silicon layer and then, an N− silicon layer, one on top of the other. Trenches are etched through the top 3 layers to form islands that are the MOSHFETs heterojunction channel. A gate deposited or grown in a trench extends vertically from the drain at the bottom of the trench to the source in the layer near the top of the trench.

14 Claims, 7 Drawing Sheets

METHOD OF FABRICATING A METAL OXIDE SEMICONDUCTOR HETEROJUNCTION FIELD EFFECT TRANSISTOR (MOSHFET)

FIELD OF THE INVENTION

The present invention relates to semiconductor devices and the method of manufacture thereof and more particularly, the present invention relates to Metal Oxide Semiconductor Field Effect Transistors (MOSFETs) having self-aligned source and drain regions.

BACKGROUND OF THE INVENTION

Field Effect Transistors (FET's) are known in the art. Insulated Gate FET's, more commonly called MOSFET's, are also known in the art. Methods of fabricating n Channel and p Channel MOSFETs are known in the art. The simplest MOSFET model is a switch wherein, if the correct voltage is applied to the MOSFET's gate turning on the device (the switch is closed) the MOSFET's Source and Drain terminals are shorted; otherwise, the switch is open.

Reducing MOSFET dimensions is a primary goal of device designers. Reducing the minimum device shade and size results in smaller, denser circuits and denser integrated circuit chips. Because device shapes are smaller, loads are smaller resulting in faster circuits and faster integrated circuit chips. Smaller, faster integrated circuit chips lead to smaller, faster, and more powerful systems, the ultimate goal.

An early attempt at reducing device sizes was V-groove technology (VMOS). V-groove MOSFETS had longer electrical channel lengths than physical length, i.e., the distance between the source and drain. The VMOS device's drain and source were on opposite sides of the groove with the channel in the groove. So, these VMOS devices provided a way to reduce physical dimensions without reducing electrical dimensions.

However, reducing MOSFET electrical dimensions resulted in problems known, generally, as short channel effects. One such problem, avalanche effect, is the result of a reduced pinchoff voltage $V_p$ for short channel devices. Avalanche effect leads to channel current leakage into the substrate. To reduce avalanche effect, the drain voltage for short channel MOSFETs is limited. For short channel devices, avalanche effect may be more troublesome than simply causing substrate leakage. Substrate leakage current may be sufficient to forward bias the source to substrate junction. This junction also behaves as the base-emitter junction of a parasitic lateral transistor with the device's drain acting as the collector. At sufficient substrate leakage, the parasitic transistor turns on, and amplifies the leakage so that the drain to source leakage is several times the normal channel leakage. With sufficient leakage, the device fails catastrophically.

One approach to reducing avalanche effect for short channel devices was to reduce the substrate doping level (to about $10^{15}$ cm$^{-3}$). Reducing the doping level increases leakage resistance. However, low substrate doping extends the drain's depletion layer. For short channel devices, the drain's depletion layer extends into the source's depletion layer, causing punchthrough. Further, increasing drain voltage reduces the source junction barrier to increase punchthrough. Thus, prior art device designers were faced with the dilemma of either increasing the channel dopant level and accepting the risk of avalanche breakdown, or, of reducing the dopant level and risking incurring equally disastrous punchthrough problems. However, both alternatives required reducing operating voltages.

Additionally, there is always source minimum substrate leakage because, regardless of the magnitude of the drain to source voltage $V_{ds}$, some electrons flow into the substrate. Electron flow is intended to be horizontal, through the channel from the source to the drain. Because the source and drain regions are ion implanted, the channel's doping profile peak is near the silicon surface and decreases exponentially, vertically, into the substrate. The electric field created by the doping profile forces electrons downward, not laterally as intended. This downward field is the cause of that minimum substrate leakage.

SUMMARY OF THE INVENTION

The present invention is a new MOSFET, a Metal Oxide Semiconductor Heterojunction Field Effect Transistor (MOSHFET), and a method of manufacturing the MOSHFET. The method comprises the steps of growing a plurality of layers of semiconductor material; etching a plurality of first trenches through at least three of said plurality of layers; growing an oxide layer, said oxide layer filling said first trenches; selectively etching a plurality of second trenches in said oxide, each said second trench being etched to expose a side wall of one of said first trenches; passivating a portion of said exposed wall; filling said second trenches with polysilicon; annealing said polysilicon to outdiffuse a dopant from said polysilicon into said exposed wall; selectively removing oxide from a plurality of said first trenches to open a plurality of gate trenches; forming a gate in each of said plurality of gate trenches; and forming source and drain contacts.

PURPOSES OF THE INVENTION

It is a purpose of the present invention to reduce MOSFET minimum channel length.

It is another purpose of the present invention to improve short channel MOSFET fabrication.

It is yet another purpose of the present invention to improve performance of short channel MOSFET circuits.

It is yet another purpose of the present invention to reduce short channel MOSFET substrate leakage.

It is yet another purpose of the present invention to increase short channel MOSFET breakdown voltage.

It is yet another purpose of this invention to reduce short channel MOSFET substrate leakage, while increasing breakdown voltage and improving circuit performance.

BRIEF DESCRIPTION OF THE DRAWINGS

While the specification concludes with claims particularly pointing out and distinctly claiming that which is regarded as the present invention, details of the preferred embodiments of the invention may be more readily understood from the following technical description when read with the drawings, wherein:

DETAILED DESCRIPTION OF THE PREFERRED EMBODIMENT

While the present invention has three alternate preferred embodiments, herein described, these embodiments share a common basic structure that is manufactured as represented in FIGS. 1A–1E. The present invention is a new vertical MOS Heterojunction FET (MOSHFET). The MOSHFET is formed in a multilayered wafer. The multilayered wafer has at least 4 layers of at least 2 different semiconductor materials.

Figure 1A:
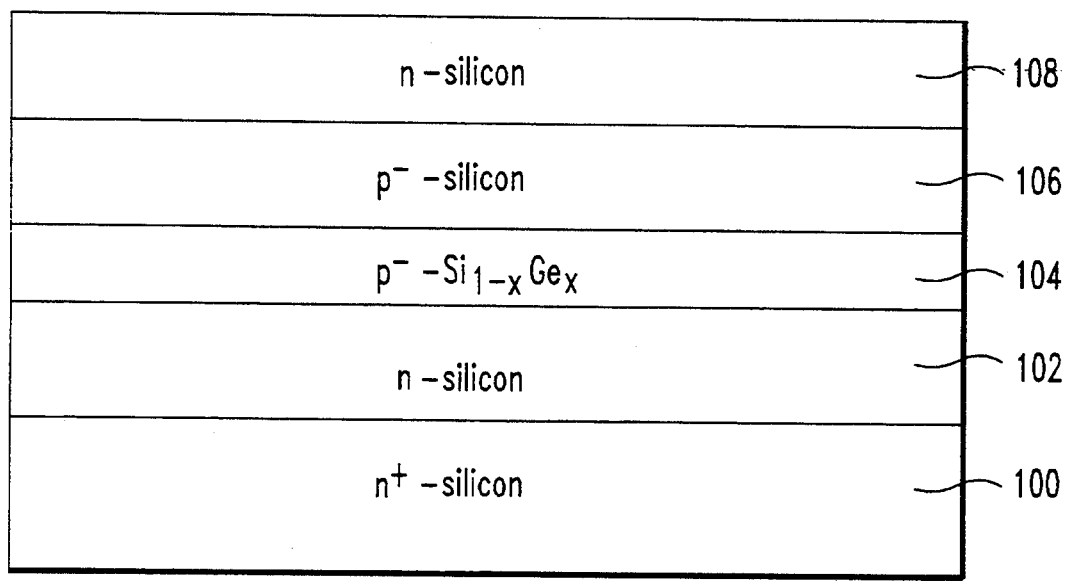
FIG. 1A-1K illustrate structural sectional views of the vertical MOSHFET at various stages of fabrication.

FIG. 1A is a cross-sectional view of the 5-layered wafer of the preferred embodiment of the present invention. First, a 1.0 to 2.0 μm thick n+ silicon substrate layer 100 has a 0.1 to 0.3 μm n silicon drain layer 102 grown on it. The substrate layer 100 has a dopant density ($N_{ds}$) of $5 \times 10^{18}/cm^3$. The n silicon layer 102 has a dopant density $N_{dd}$ of $10^{17}/cm^3$. Next, a 200 Å first channel layer 104 of p− doped $Si_{1-x}Ge_x$ (where x is the mole fraction of germanium) is grown on the {100} plane of the n silicon layer 102. A second channel layer 106 of p type silicon is grown on layer 104. Layer 106 is preferably 0.1 μm thick and has a dopant density $N_{ar}=10^{15}/cm^3$. Finally, a 0.2 μm source layer 108 of n type silicon with a dopant density $N_{dt}=10^{18}/cm^3$ is grown on layer 106.

First channel layer 104 can be a thin layer of $Si_{1-x}Ge_x$ grown on a silicon substrate. However, strain forms in an alloy of germanium and silicon because the lattice constant of the two crystals is different. Consequently, the alloy's germanium crystal lattice is compressed into a pseudomorphic layer that has enhanced electron and hole mobility. Therefore, x must be such that this layer strain is maintained. Thus, it is contemplated that $0.01 \leq x \leq 0.25$, and, preferably x=0.18. Furthermore, the thickness of $Si_{1-x}Ge_x$ layer 104 is sufficient to maintain a pseudomorphic monocrystalline structure, preferably, between 50 and 300 Å. The doping density, $N_{ab}$, is $10^{15}/cm^3$ for layer 104.

Figure 1B:
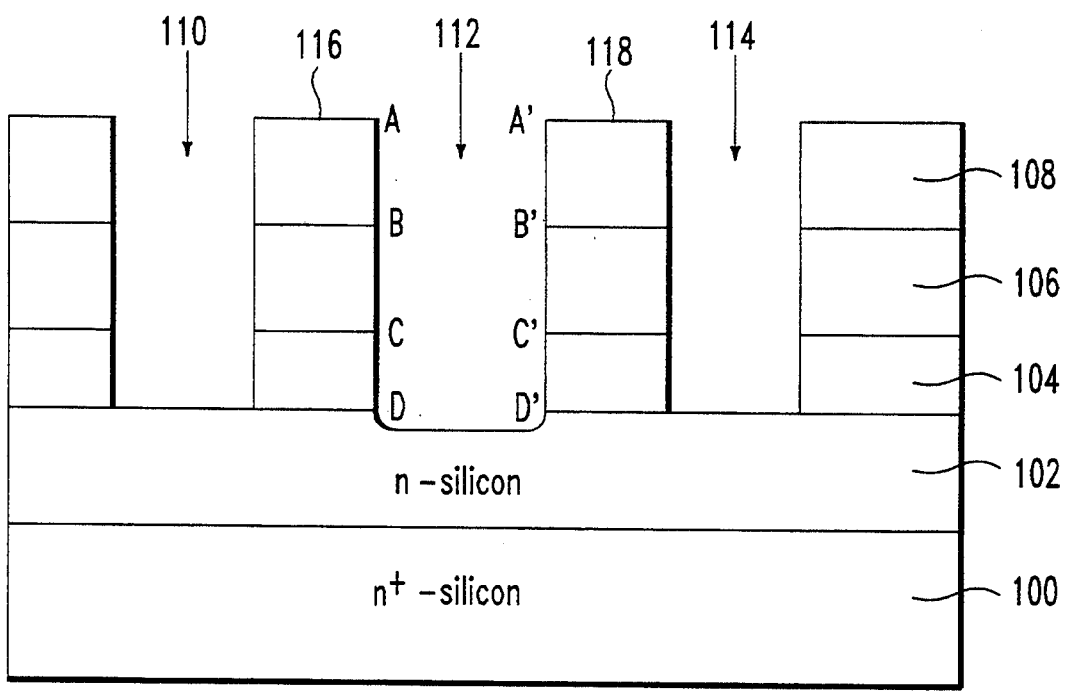

The preferred embodiments of the MOSHFET of the present invention are formed in these initial layers 100–108. First, as represented in FIG. 1B, trenches 110, 112, and 114 are etched into and through layers 108, 106, and 104, respectively, with center trench 112 partially extending into layer 102. In the preferred embodiments of the present invention, trenches 110, 112, and 114 are each ≦0.5 μm wide (it is desired that these trenches be as narrow as possible to minimize device size). Islands 116 and 118, between the trenches 110, 112, and 114, are 0.1 to 0.5 μm wide. These islands are defined with electron beam lithography when the Si and SiGe layers are mesa etched with an $SF_6$ and $CF_3Br$ plasma to form trenches 110, 112, and 114. Islands 116 and 118 define a vertical MOSHFET.

After etching trenches 110, 112, and 114, Arsenic is ion implanted into n source layer 108 to a dopant density of about $10^{20}/cm^3$. This Arsenic dopant insures resistive metal contacts and further defines the MOSHFET's source.

Figure 1C:
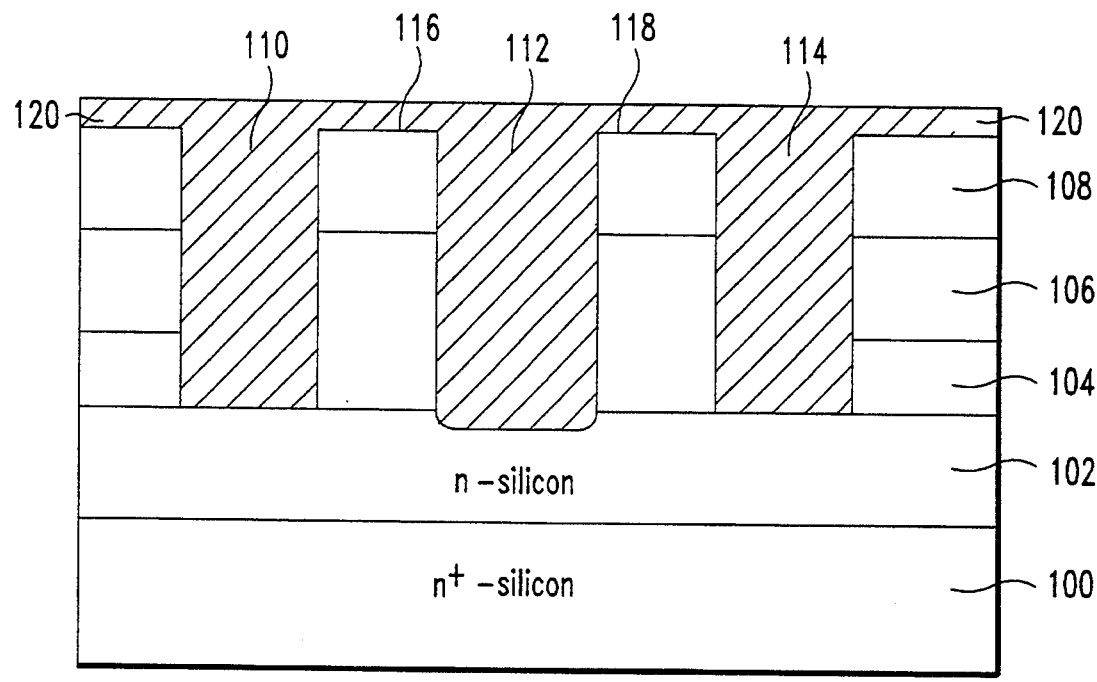
Figure 1D:
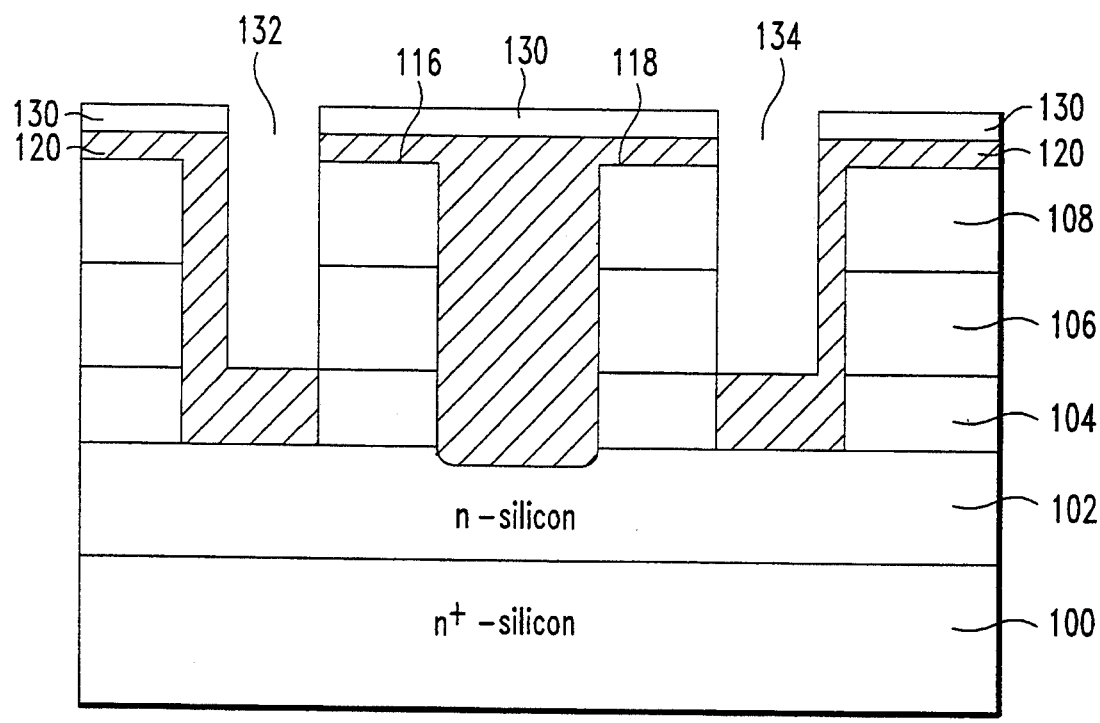

After defining the MOSHFET's source, the trenches 110, 112, and 114 are filled by an $SiO_2$ (Oxide) dielectric layer, 120 in FIG. 1C, grown over the surface of the structure. New trenches 132 and 134 are formed when the $SiO_2$ layer 120 is anisotropically etched through a photoresist pattern, 130 in FIG. 1D, to partial reopen the trenches 110 and 114, and reexpose the sidewalls of layers 108 and 106 on one side of each of islands 116 and 118. These new trenches 132, 134 provide a channel doping aperture.

Figure 1E:
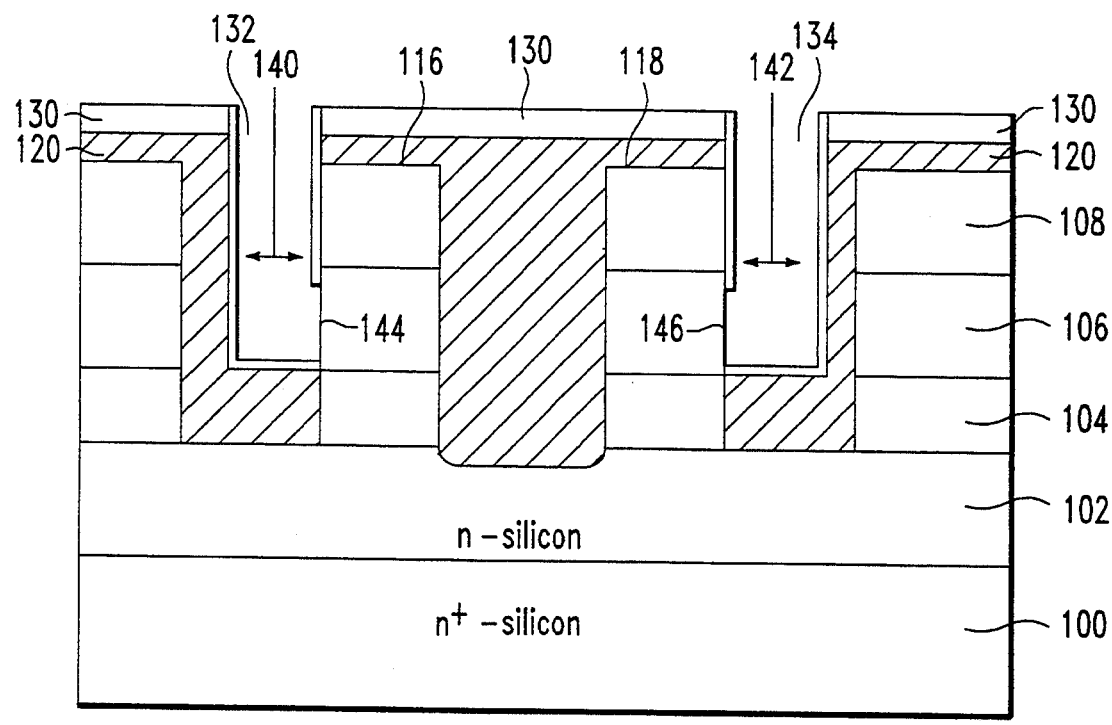

Once trenches 132 and 134 are opened, a protective layer of silicon nitride, 140 in FIG. 1E, is deposited on the structure selectively. The silicon nitride 140 is anisotropically etched in the trenches 132 and 134 to reexpose the side wall of silicon channel layer 106 in 144 and 146, while leaving the sidewall of layers 104 and 108 protected.

Figure 1F:
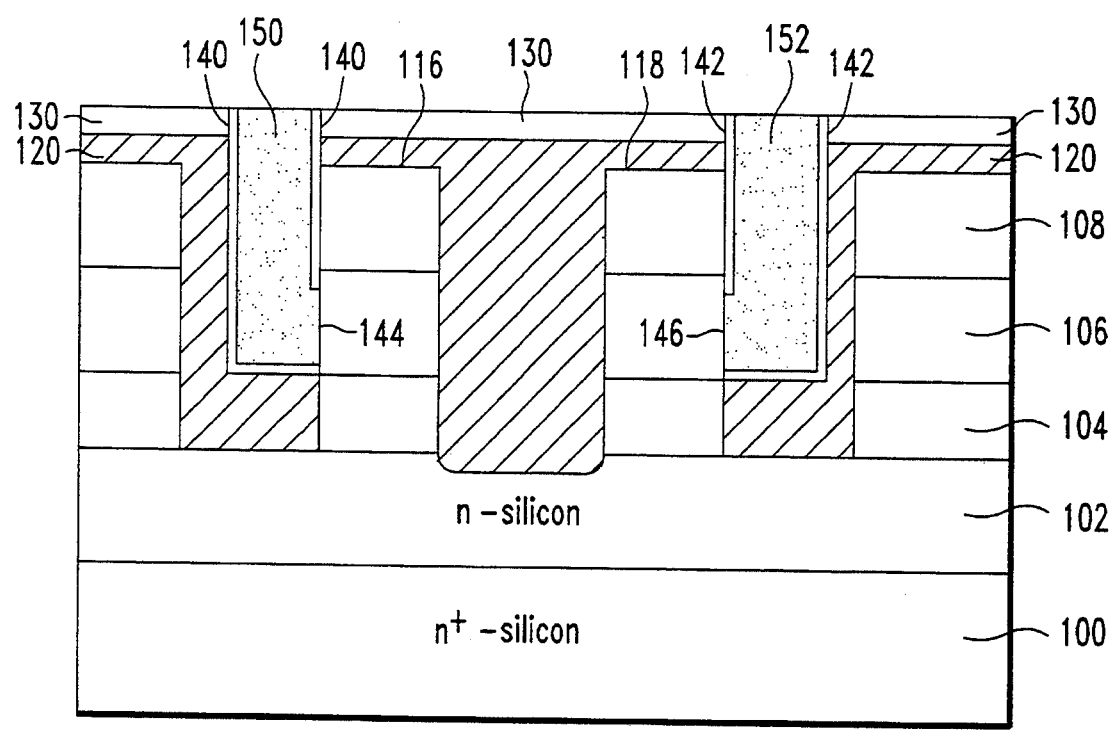

The channel layer 106 is doped by outdiffusion from p doped Polysilicon plugs 150 and 152 in FIG. 1F. The polysilicon plugs 150 and 152 are made by depositing or growing sufficient polysilicon over the structure to fill trenches 132 and 134. The polysilicon may be p doped or, alternatively, intrinsically doped polysilicon may be deposited and then ion implanted with a p type dopant, that is subsequently diffused into the Polysilicon. Next, excess polysilicon is etched away from the structure surface of mask layer 130, leaving polysilicon plugs 150 and 152 in former trenches 132 and 134.

Figure 1G:
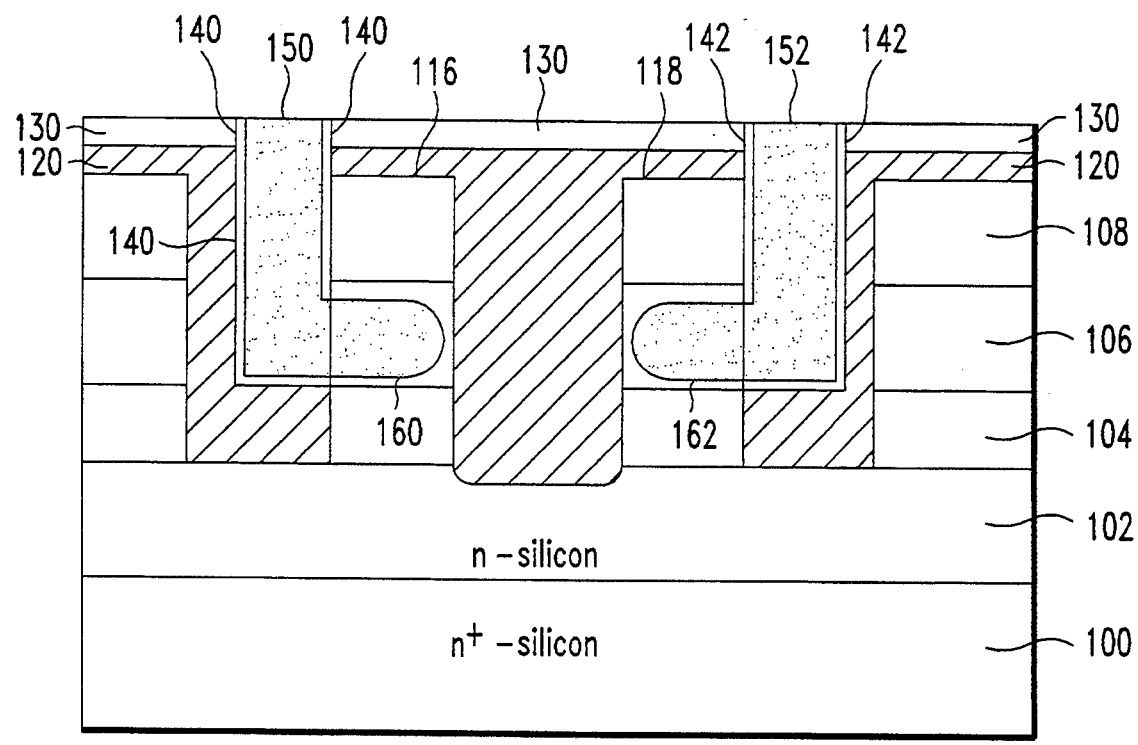

To diffuse dopant from the polysilicon plugs 150 and 152 into the channel layer 106, the structure is annealed at an annealing temperature lower than 900° C. During annealing, the p type dopant outdiffuses from the polysilicon plugs 150 and 152 into channel layer 106, forming diffusion regions 160 and 162 in FIG. 1G. Preferably, diffusion regions 160 and 162 are doped to at least $10^{19}/cm^3$.

Figure 1H:
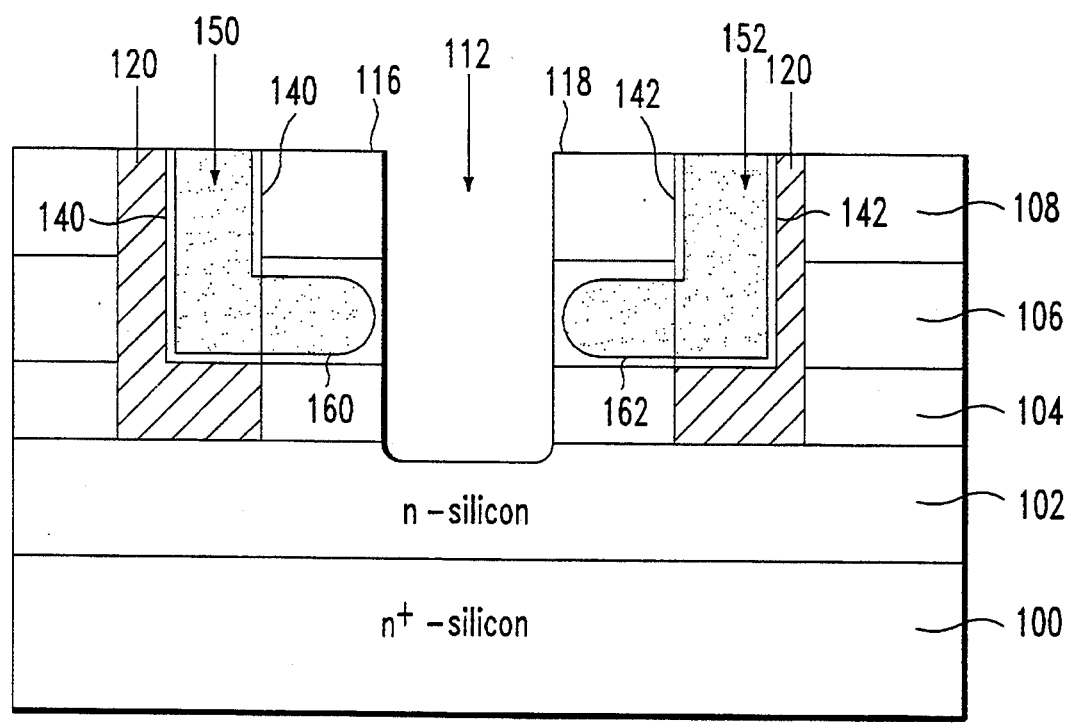
Figure 1I:
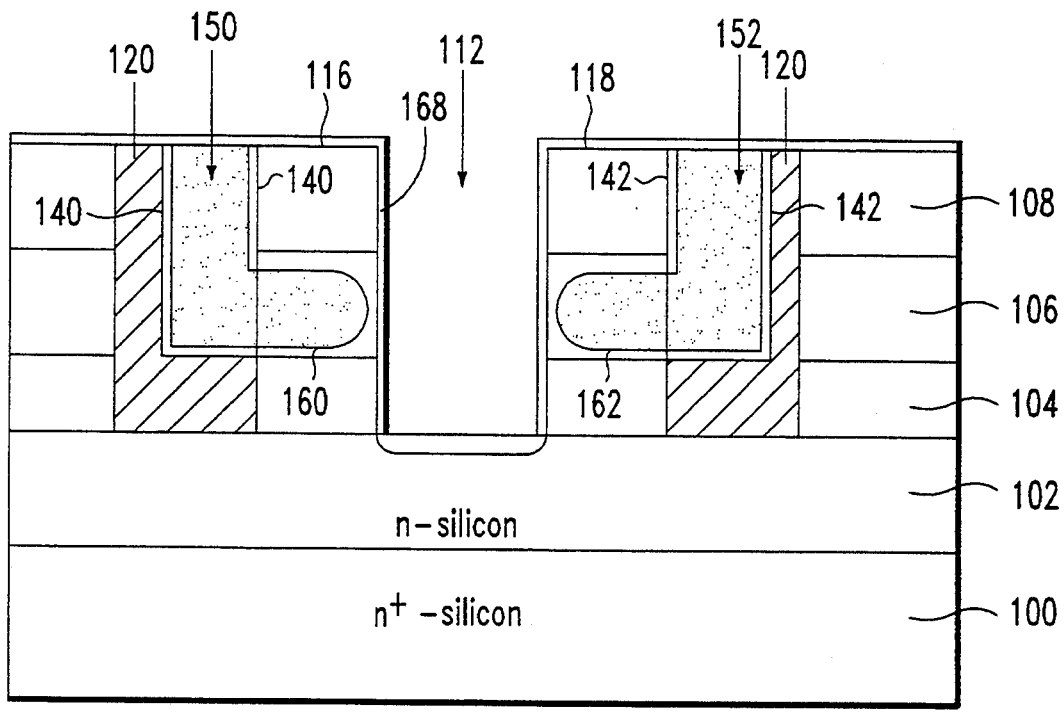
Figure 1J:
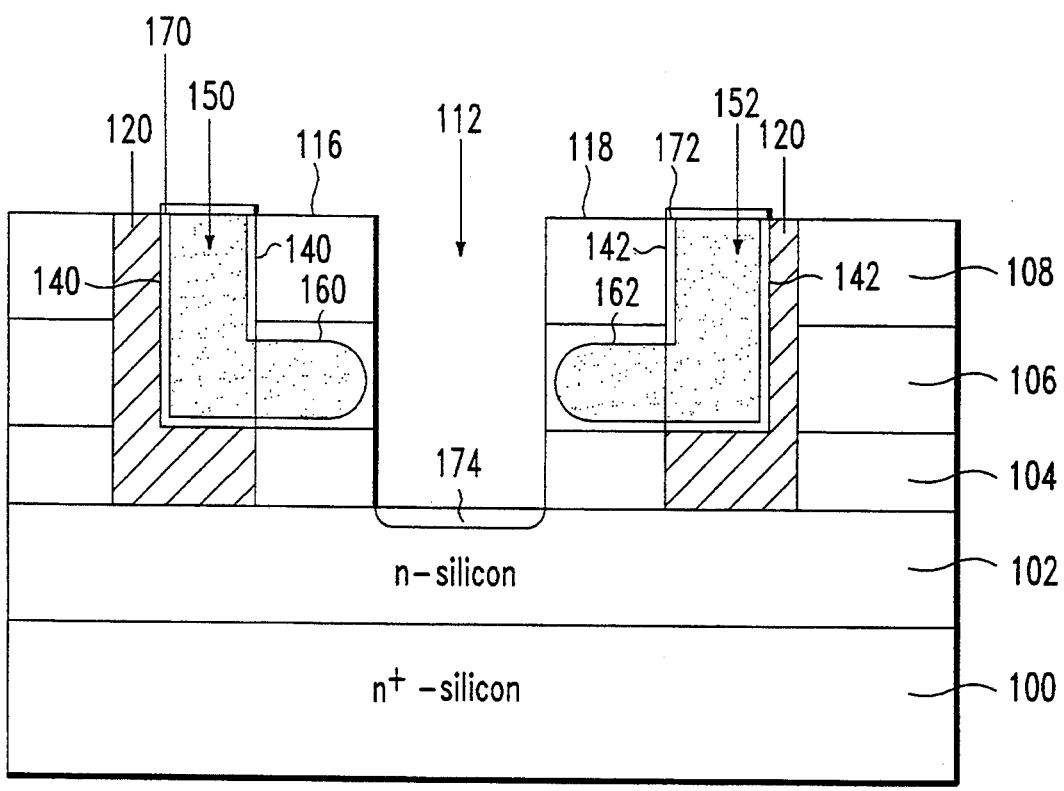

After annealing, the remainder of mask layer 130 is removed. Silicon dioxide 120 is removed from the central trench 112 and selectively removed from the top surface 164 of n source layer 108. The top surface 164 is planarized by a conventional chem-mech polish step to provide the structure of FIG. 1H. A thin nitride layer, 168 in FIG. 1I, is deposited on the planarized source surface 164. Next, the nitride layer is selectively etched to leave nitride caps 170 and 172 over the polysilicon plugs 150 and 152 and a thin nitride plug 174 in the bottom of central trench 112 as in FIG. 1J.

Figure 1K:
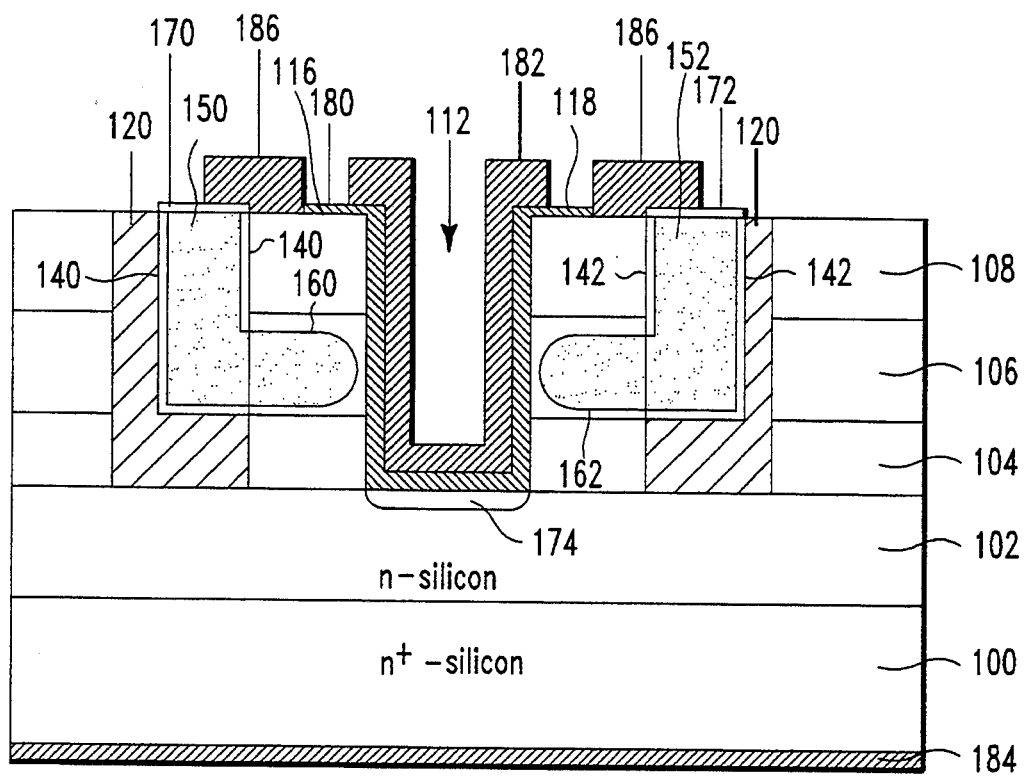

The first preferred MOSHFET is completed by defining the gate. A 100 Å thick gate oxide 180 in FIG. 1K is either grown in trench 112 and then, selectively etched away, or, alternatively, the gate oxide 180 is selectively deposited in trench 112. The contacts to the gate 182 and the drain and source may be made in any conventional manner. The gate may be polysilicon or metal. If polysilicon, a polysilicon layer is deposited and selectively etched, to leave the polysilicon MOSHFET gate 182, and drain and source contacts 184 and 186. Alternatively, metal is deposited on the structure and then, selectively etched away.

The Si/SiGe junction of the present invention MOSHFET has a conduction band discontinuity $\Delta E_c$, (a potential spike) that forms a 0.01–0.02 eV high electron barrier in the channel and, a valence band discontinuity, $\Delta E_v$ that forms a 0.01–0.02 eV high hole barrier in the channel. While $\Delta E_c$ is not sufficient to suppress electron flow from the source to the drain, it suppresses the subthreshold current that normally plagues MOSFETs. $\Delta E_v$ suppresses formation of a parasitic NPN bipolar transistor. Further, because the dopant diffused from the polysilicon does not extend to the source/channel junction, i.e., the interface of layers 106 and 108, the source junction capacitance is lower, similar to that for a lightly doped drain FET. Also, drain current is increased because the non-uniform dopant density which tends to force electrons downward, enhances normal current flow into the drain.

Figure 2:
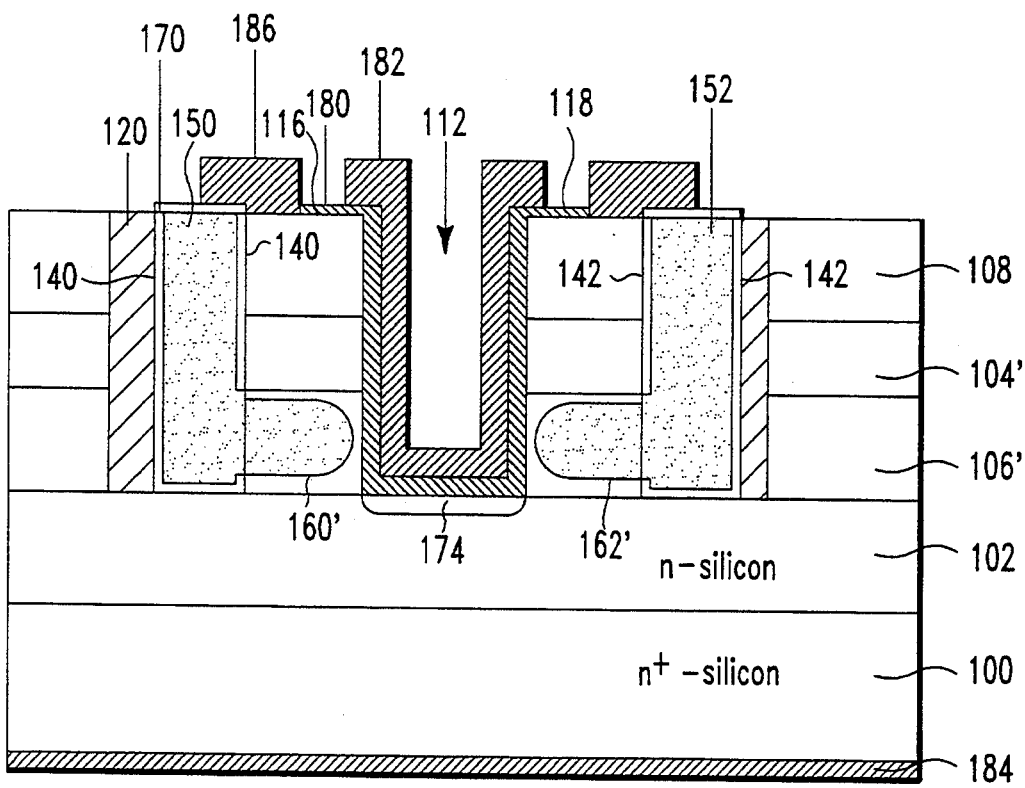
FIG. 2 illustrates a cross-sectional view of the MOSHFET fabricated according to a second embodiment of the present invention.

FIG. 2 is a second preferred embodiment MOSHFET, wherein layers 104 and 106 are swapped, i.e., layer 106' is grown before layer 104'. This alternate preferred embodiment MOSHFET is more immune to impact ionization than the first preferred embodiment MOSHFET. This second preferred embodiment MOSHFET has electrical characteristics similar to a lightly doped drain FET. Consequently, the second preferred embodiment MOSFET has an even higher breakdown voltage than the first preferred embodiment MOSHFET. As the lightly doped layer 104' separates the heavily doped layers 106' and 108, the capacitance of this second preferred MOSHFET will still be lower than the capacitance of the MOSHFET of the first preferred embodiment.

Figure 3:
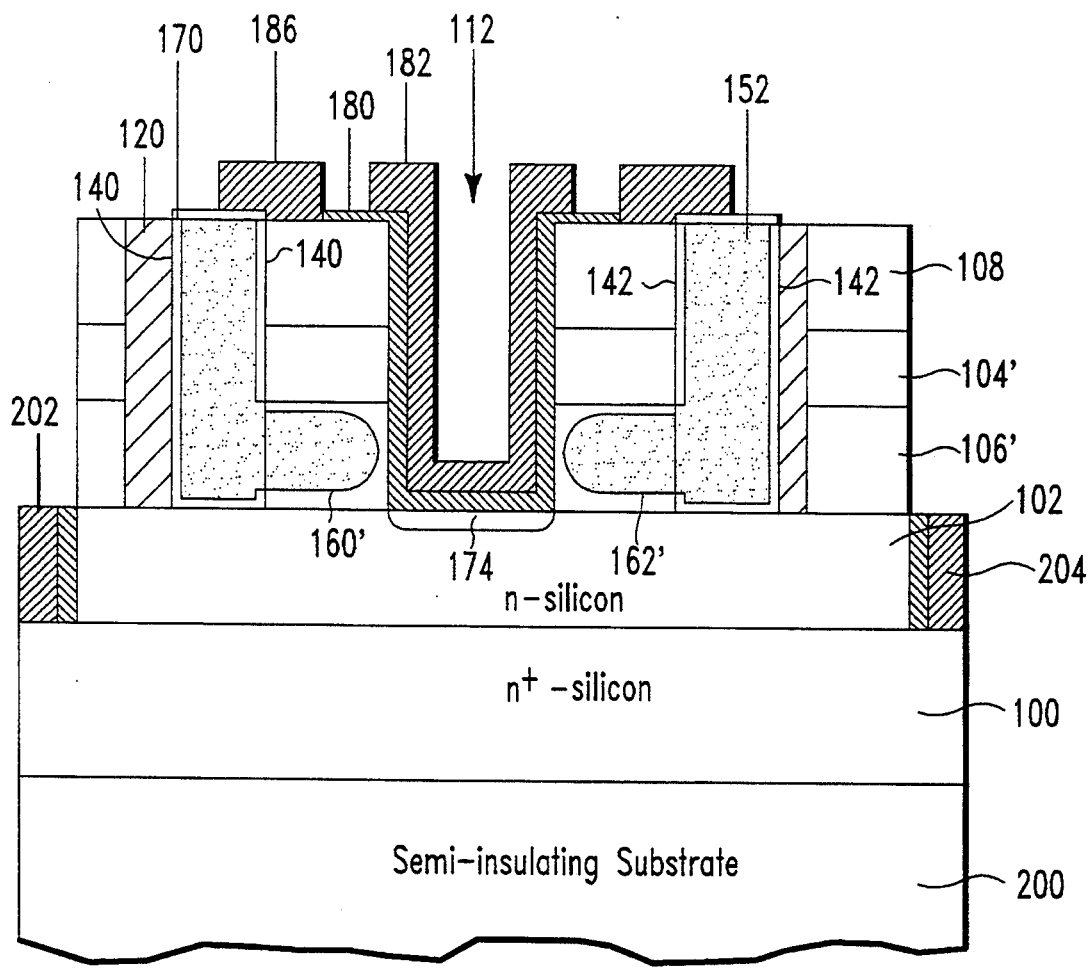
FIG. 3 illustrates the cross-sectional view of an alternate structure of the MOSHFET fabricated according to a second embodiment of the present invention.

Although both MOSHFET embodiments have a backside drain contact 184, a third preferred embodiment in FIG. 3 does not. The MOSHFET of the third preferred embodiment has an insulating substrate 200 and top side drain contacts 202 and 204. Except as noted, both the second and third embodiment MOSHFETs are made following substantially the same steps as followed for making the first embodiment. In all three preferred embodiments, because the layer thicknesses of the layered wafer can be precisely controlled, the MOSHFET's channel length can be as small as 100 Å without significant short channel effects. These 100 Å MOSHFETs still have low output conductance, threshold voltage and capacitance, and high transconductance and cutoff frequency.

While the above preferred embodiments of the present invention have been described in a specific arrangements of p and n type materials, it will be understood by a person of ordinary skill in the art that p-type dopant and n type dopant may be swapped without departing from the invention. Further, variations and modifications will occur to a person of ordinary skill in the art without departing from the spirit and scope of the present invention.

I claim:

1. A method of manufacturing a Metal Oxide Semiconductor Field Effect Transistor (MOSFET) having a source, a drain, and a gate, said method comprising the steps of:
   (a) growing a layered wafer having at least four semiconductor layers;
   (b) etching a plurality of first trenches through at least the top three of said semiconductor layers;
   (c) growing an oxide layer on the top of said semiconductor layers, said oxide layer filling said first trenches;
   (d) selectively etching a plurality of second trenches through said oxide layer, such that the side wall of at least one of said first trenches is exposed;
   (e) insulating a portion of each said exposed side wall;
   (f) filling each of said second trenches with a polysilicon plug and annealing said layered wafer;
   (g) selectively etching at least one of said filled first trenches to form at least one gate trench and forming a gate therein; and
   (h) forming a conductive contact for said gate and said polysilicon plugs.

2. The method of claim 1 wherein the step (a) of growing a layered wafer comprises:
   i) growing a first semiconductor layer having a first dopant type impurity at a first dopant concentration;
   ii) growing a second semiconductor layer having said first dopant type impurity at a second dopant concentration;
   iii) growing a third semiconductor layer having a second dopant type impurity;
   iv) growing a fourth semiconductor layer having said second dopant type impurity; and
   v) growing a fifth semiconductor layer having said first dopant type impurity.

3. The method of claim 2 wherein the first, second, fourth and fifth semiconductor layers are comprised of silicon and the third semiconductor layer is comprised of SiGe.

4. The method of claim 3 wherein the step (d) of selectively etching said second trenches exposes the side wall at the fourth and fifth said semiconductor layers.

5. The method of claim 4 wherein said passivated side wall portion comprises said exposed fifth semiconductor layer.

6. The method of claim 2 wherein said first dopant type impurity is n type and said second dopant type impurity is p type.

7. The method of claim 2 wherein said first dopant type impurity is p type and said second dopant type impurity is n type.

8. The method of claim 2 wherein the first, second, third and fifth semiconductor layers are silicon and the fourth semiconductor layer is SiGe.

9. The method of claim 8 wherein the step (d) of selectively etching said second trenches exposes the side wall at the third, fourth and fifth semiconductor layers.

10. The method of claim 9 wherein said passivated side wall portion comprises said exposed fourth and fifth semiconductor layers.

11. The method of claim 1 wherein the step (g) of selectively etching at least one of said filled trenches and forming a gate therein comprises the steps of:
   i) capping the bottom of said etched gate trench with an insulating material;
   ii) growing gate oxide on said cap; and
   iii) forming a conductive gate on said gate oxide.

12. The method of claim 11 wherein said conductive gate is polysilicon.

13. The method of claim 11 wherein said conductive gate is metal.

14. The method of claim 1 wherein said layered wafer is grown on an insulating substrate.

* * * * *